(12) United States Patent
Li et al.

(10) Patent No.: US 11,600,508 B2
(45) Date of Patent: Mar. 7, 2023

(54) MICRO-COMPONENT TRANSFER HEAD, MICRO-COMPONENT TRANSFER DEVICE, AND MICRO-COMPONENT DISPLAY

(71) Applicant: PlayNitride Display Co., Ltd., MiaoLiCounty (TW)

(72) Inventors: Yu-Chu Li, MiaoLi County (TW);
Pei-Hsin Chen, MiaoLi County (TW);
Yi-Chun Shih, MiaoLi County (TW);
Yi-Ching Chen, MiaoLi County (TW)

(73) Assignee: PlayNitride Display Co., Ltd., MiaoLi County (TW)

( * ) Notice: Subject to any disclaimer, the term of this patent is extended or adjusted under 35 U.S.C. 154(b) by 285 days.

(21) Appl. No.: 15/931,621

(22) Filed: May 14, 2020

(65) Prior Publication Data

US 2021/0151341 A1    May 20, 2021

(30) Foreign Application Priority Data

Nov. 18, 2019  (TW) ................................. 108141701

(51) Int. Cl.
*H01L 21/683* (2006.01)
*H01L 23/00* (2006.01)

(52) U.S. Cl.
CPC .......... *H01L 21/6833* (2013.01); *H01L 24/04* (2013.01); *H01L 24/83* (2013.01); *H01L 2224/75725* (2013.01)

(58) Field of Classification Search
CPC .................................................. H01L 21/6833
See application file for complete search history.

(56) References Cited

U.S. PATENT DOCUMENTS

| | | | |
|---|---|---|---|
| 9,870,959 B1* | 1/2018 | Vodrahalli | H01L 22/34 |
| 2003/0216053 A1* | 11/2003 | Miyata | H01L 21/6715 |
| | | | 438/758 |
| 2013/0300812 A1* | 11/2013 | Bibi | B81C 99/002 |
| | | | 347/159 |
| 2015/0216042 A1 | 7/2015 | Golda et al. | |
| 2016/0144608 A1* | 5/2016 | Chang | H01L 24/75 |
| | | | 156/249 |

(Continued)

FOREIGN PATENT DOCUMENTS

| | | |
|---|---|---|
| CN | 101807660 | 8/2010 |
| CN | 105609455 | 5/2016 |
| CN | 109411392 | 3/2019 |

OTHER PUBLICATIONS

"Office Action of China Counterpart Application", dated Oct. 22, 2021, p. 1-p. 7.

(Continued)

*Primary Examiner* — Christopher A Johnson
(74) *Attorney, Agent, or Firm* — JCIPRNET (57) ABSTRACT

Herein disclosed are a micro-component transfer head, a micro-component transfer device, and a micro-component display. Said micro-component transfer head comprises a carrying surface that corresponds to a micro-component extraction area. Said extraction area conforms with a first geometric object, which comprises at least an acute angle. A second geometric object comprises at least a right angle and is constituted of n copies of the first geometric object, n being an integer greater than 1. The shape of the first geometric object differs from that of the second.

16 Claims, 8 Drawing Sheets

(56) References Cited

U.S. PATENT DOCUMENTS

| | | |
|---|---|---|
| 2017/0062683 A1 | 3/2017 | Chen et al. |
| 2018/0261582 A1 | 9/2018 | Henry et al. |
| 2019/0035662 A1* | 1/2019 | Wu .................... H01L 21/67754 |
| 2019/0214522 A1* | 7/2019 | Hsiang ................ H01L 25/0753 |
| 2021/0035850 A1* | 2/2021 | Shirley ............. H01L 21/67103 |
| 2021/0057278 A1* | 2/2021 | Bae .......................... H01L 21/78 |
| 2021/0143030 A1* | 5/2021 | Lim ...................... H01L 33/486 |
| 2022/0123165 A1* | 4/2022 | Ahn .................... H01L 25/0753 |

OTHER PUBLICATIONS

"Notice of Allowance of China Counterpart Application," dated Nov. 4, 2022, p. 1-p. 4, in which the listed reference was/references were cited.

* cited by examiner

MICRO-COMPONENT TRANSFER HEAD, MICRO-COMPONENT TRANSFER DEVICE, AND MICRO-COMPONENT DISPLAY

CROSS REFERENCE TO RELATED APPLICATION

The present application claims priority to Taiwan patent application Serial No. 108141701 filed on Nov. 18, 2019, the entire content of which is incorporated by reference to this application.

BACKGROUND OF THE INVENTION

1. Field of the Invention

The present invention pertains to a micro-component transfer head, a micro-component transfer device, and a micro-component display. In particular, the micro-component transfer head and the micro-component transfer device improve micro-LED transfer efficiency, and are employed in the manufacture of the micro-component display.

2. Description of the Prior Art

Contemporary production methods dictate that micro light-emitting diodes (μLEDs), once epitaxially grown on a wafer, are extracted (by a transfer head) and transferred to a receiving substrate for posterior processing or shipment. Said extraction, if done one μLED at a time, is predictably time-consuming, as the μLEDs are micrometers in scale. There is ongoing research on mass transfer to increase the efficiency while transferring μLEDs. Conventionally, the carrying surface of the transfer head may be used to contact the wafer many times to perform the mass transfer of the μLEDs epitaxially grown on the wafer.

To save production costs, the manufacturing of the μLEDs would be completed within the wafer as possible; however, not all the μLEDs epitaxially grown on the wafer would be extracted successfully. One factor is that the surface of the wafer is nearly round, whereas the carrying surface of the conventional transfer head is a rectangle or a square. Thus, due to the mismatch of the shape of the carrying surface and the wafer, a portion of μLEDs with normal functions would not be extracted as they are situated near the margins of the wafer. Hence, there is a need in industry for a novel transfer head that is capable of fully extracting the μLEDs on the wafer and further improving the efficiency to utilize the wafer.

SUMMARY OF THE INVENTION

The present invention provides a micro-component transfer head, whose improved carrying surface facilitates access to hard-to-extract micro-components by the fringe of a wafer, thus increasing wafer usage.

The present invention discloses a micro-component transfer head, which comprises a carrying surface that corresponds to a micro-component extraction area. The micro-component extraction area conforms with a first geometric object, which comprises at least an acute angle. A second geometric object comprises at least a right angle and is constituted of n copies of the first geometric object, n being an integer greater than 1. The shape of the first geometric object differs from that of the second geometric object.

In some embodiments, when coming into contact with a surface of a wafer, the carrying surface is configured to extract a plurality of micro-components situated at the surface and within the micro-component extraction area. The first geometric object may be triangular while the second geometric object is rectangular. The first geometric object may further comprise a right angle, with n as an even number. Alternatively, the first geometric object may be a circular sector while the second geometric object is circular.

The present invention provides a micro-component transfer device, whose improved carrying surface facilitates access to hard-to-extract micro-components by the fringe of a wafer, thus increasing wafer usage.

The present invention discloses a micro-component transfer device, configured to extract a plurality of micro-components in a wafer. The micro-component transfer device comprises a platform configured to hold the wafer and a micro-component transfer head positioned opposite the platform. The micro-component transfer head comprises a carrying surface corresponding to a micro-component extraction area, wherein the micro-component extraction area conforms with a first geometric object, and a first end of the first geometric object is generally aligned with the center of the wafer.

In some embodiments, the first end of the first geometric object may be an acute angle, and the first geometric object may be triangular or a circular sector. Alternatively, the platform may further be configured to rotate the wafer while generally keeping the center of the wafer stationary.

The present invention provides a micro-component display, which is able to receive a plurality of the micro-components transferred in a batch from the micro-component transfer head and the micro-component transfer device, achieving the goal of mass transfer of the micro-components.

The present invention discloses a micro-component display, which comprises a receiving substrate having a display surface, wherein the display surface comprises a plurality of micro-component carriage areas. Each of the micro-component carriage areas conforms with a first geometric object which comprises at least an acute angle, and within each of the micro-component carriage areas there are a plurality of micro-components. The micro-components within the same one of the micro-component carriage areas are spaced a first distance apart, and the micro-components within different ones of the micro-component carriage areas are separated by at least a second distance, the first distance being unequal to the second distance.

In some embodiments, the display surface contains a second geometric object, constituted of n copies of the first geometric object with n being an integer greater than 1. The second geometric object comprises at least a right angle, and the first geometric object is dissimilar in shape to the second geometric object. Alternatively, the display surface may conform with the second geometric object.

To summarize, the micro-component transfer head and the micro-component transfer device provided in the present invention may change the shape of the micro-component extraction areas to be non-rectangular, such that the micro-component extraction areas may be closer and extend to the margins of the wafer. In this way, it can facilitate access to hard-to-extract micro-components by the fringe of a wafer, thus increasing wafer usage. Moreover, the micro-component display provided in the present invention includes a plurality of micro-component carriage areas, and each of the micro-component carriage areas is able to receive a plurality of the micro-components transferred in a batch from the micro-component transfer head and the micro-component transfer device; hence, the mass transfer of the micro-components could be achieved.

DETAILED DESCRIPTION OF THE INVENTION

The features, objectives, and functions of the present invention are further disclosed below. However, it is only a few of the possible embodiments of the present invention, and the scope of the present invention is not limited thereto; that is, the equivalent changes and modifications done in accordance with the claims of the present invention will remain the subject of the present invention. Without departing from the spirit and scope of the invention, it should be considered as further enablement of the invention.

Figure 1:
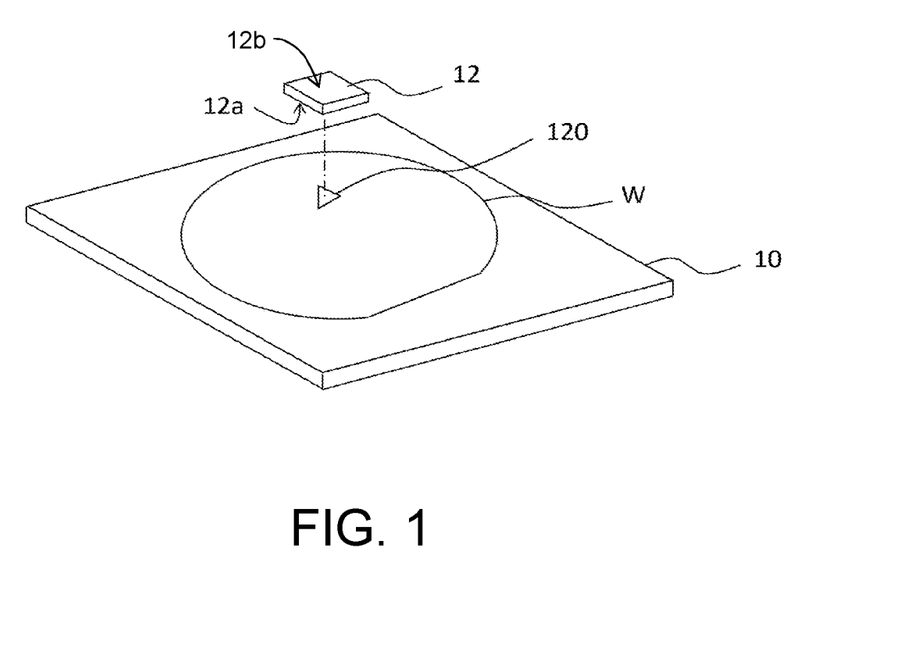
FIG. 1 is a pictorial drawing of a micro-component transfer device in accordance with an embodiment of the present invention.
Figure 1A:
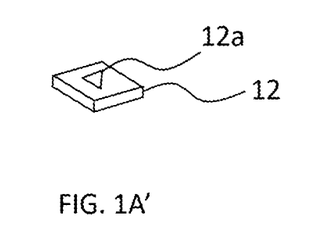
FIG. 1A' is a pictorial drawing of a part of the micro-component transfer device in accordance with another embodiment of FIG. 1.

Please refer to FIG. 1, a pictorial drawing of a micro-component transfer device 1 in accordance with an embodiment of the present invention. As shown in FIG. 1, the micro-component transfer device 1 comprises a platform 10 and a micro-component transfer head 12, and is configured to extract a plurality of micro-components (not shown) from a wafer W. The wafer W may include a temporary substrate (not shown) on which a plurality of the micro-components (not shown) can be temporarily disposed, fastened, and held for later transferral. The platform 10 is configured to hold or support the wafer W, while in the present embodiment the micro-component transfer head 12 is positioned above the platform 10. The side of the micro-component transfer head 12 facing the wafer W is defined as the carrying surface 12a, and is configured to extract the micro-components. When the carrying surface 12a comes into contact with the wafer W, it is able to extract the micro-components within a corresponding micro-component extraction area 120. The micro-component transfer head 12, of which the carrying surface 12a is the inner side, may be similar in shape or contour to the carrying surface 12a, when looked from the outside at another side 12b of the micro-component transfer head 12 that is opposite and farthest from the carrying surface 12a. Alternatively, the confines of said other side may contain the carrying surface 12a; i.e. the area of said other side is greater than that of the carrying surface 12 as FIG. 1A'. Either way, force is applied more evenly during the transferral. In one example, the carrying surface 12a is triangular while the shape of the micro-component transfer head 12 may be rectangular when looked from the outside. In another example, the area of said other side is less than that of the carrying surface 12a. In yet another embodiment not depicted, the shapes of the micro-component transfer head 12, the carrying surface 12a, and the micro-component extraction area 120 are not necessarily associated. The present invention does not require the micro-component transfer head 12 or the carrying surface 12a to be of any particular shape.

Said micro-components may be micro light-emitting diodes (μLEDs), micro laser diodes, micro-circuits, or anything else as the present invention permits. In practice, the micro-components may be micrometers in scale, meaning their lengths and widths are no greater than 100 μm, whereas the edges of the micro-component extraction area 120 are measured in centimeters. In other words, the micro-components are minuscule relative to the extraction area 120. The micro-components in the wafer W are not explicitly shown in FIG. 1 to allow for a succinct depiction of the present embodiment, as there may be hundreds, thousands, or even more of them just within the extraction area 120.

There can be many ways by which the micro-component transfer head 12 extracts the micro-components. For instance, the carrying surface 12a may be equipped with an electrode (not shown) and have the micro-component extraction area 120 correspondingly defined. The carrying surface 12a then approaches the wafer W with the electrode polarized, using electrostatic force to suck micro-components within the area 120. Alternatively, adhesive material may be disposed on the carrying surface 12a, the disposition defining the micro-component extraction area 120. When the carrying surface 12a comes into contact with the wafer W, micro-components within the area 120 are stuck onto the carrying surface 12a by the adhesive material and carried away. Note that the area of the carrying surface 12a may be unequal to that of the effective micro-component extraction area 120. In addition, while the micro-component transfer head 12 of the present embodiment is configured to extract micro-components, a person skilled in the art has the discretion to choose the means by which it does so.

Figure 2:
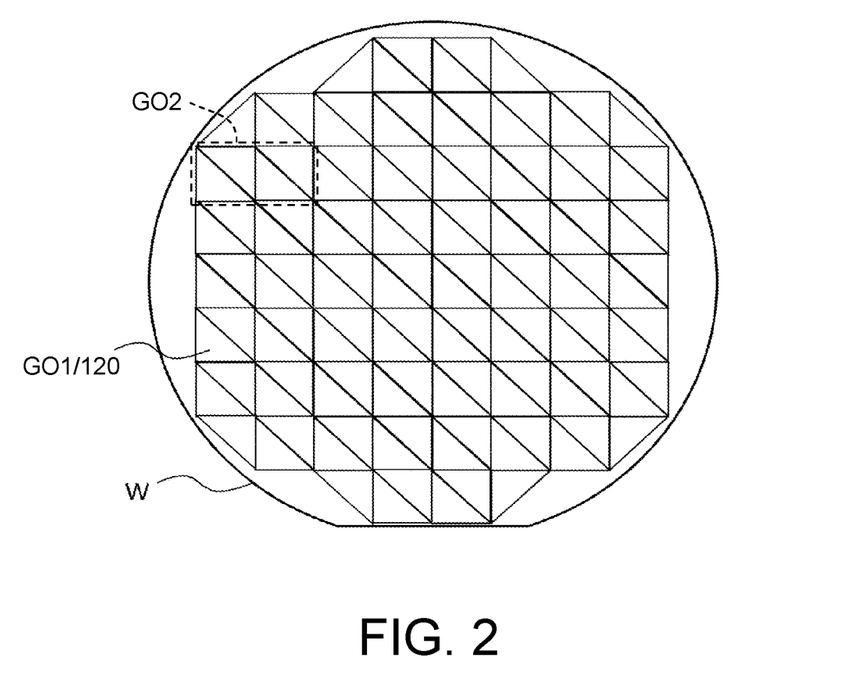
FIG. 2 depicts copies of a micro-component extraction area, in accordance with an embodiment of the present invention.

The carrying surface of a conventional transfer corresponding to the micro-component extraction area is usually rectangular. The shape of the micro-component extraction area 120 corresponding to the carrying surface 12a, however, may be different according to the present embodiment. Please refer to FIGS. 1 and 2 in conjunction. In accordance with the present embodiment, FIG. 2 depicts copies of the micro-component extraction area 120 on the wafer W. The copies are shown here to be disposed tightly together. They correspond to positions where the micro-component transfer head 12 comes into contact with different corners of the wafer W, and do not signify that actual lines of demarcation are drawn on the wafer W. There is also no inherent sequence to the copies of the micro-component extraction area 120.

Figure 3:
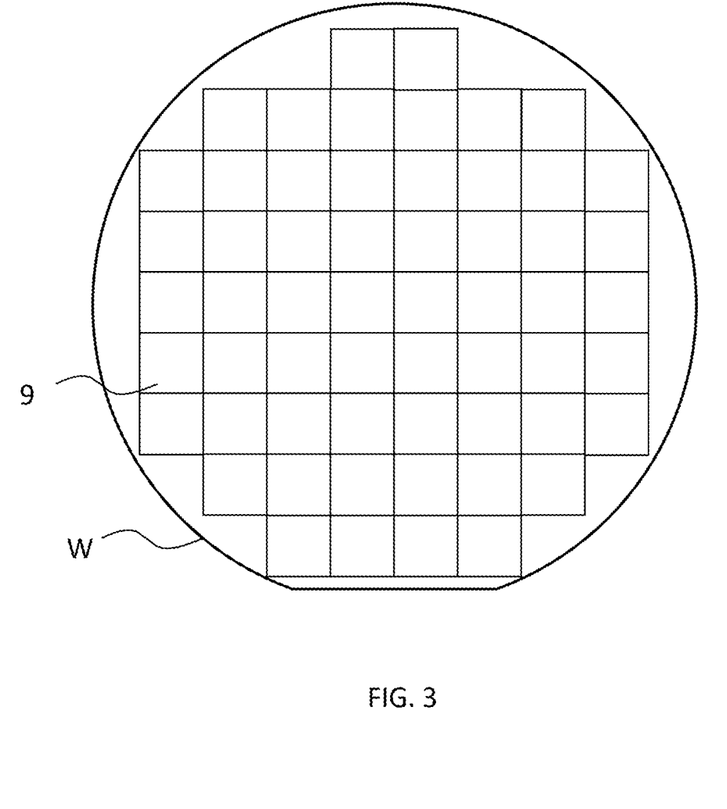
FIG. 3 depicts copies of a micro-component extraction area, in accordance with the prior art.

In FIG. 2, the copies of the micro-component extraction area 120 conform in general with a first geometric object GO1. The first geometric object GO1 may be triangular and may further be a right triangle in practice; that is, the first geometric object GO1 comprises a right angle and two acute angles. The present embodiment does not stipulate how many degrees the acute angles are; one of them may be 5°, 10°, 15°, 30°, or 45°. That the first geometric object GO1 is non-rectangular is improvement as it facilitates more effective extraction of the micro-components from the wafer W. For an illustration of this, please refer to FIGS. 2 and 3 in conjunction. In accordance with the prior art, FIG. 3 depicts copies of a micro-component extraction area 9 that is rectangular. The micro-component extraction area 9 is larger than the micro-component extraction area 120 of FIG. 2 if their edges are assumed to be of roughly the same length. Moreover, the micro-component extraction area 9 cannot provide access to micro-components on the margins of the wafer W, while with the triangular, smaller micro-component extraction area 120 one is able to get as close as possible to the edge of the wafer W. In FIG. 3, 58 copies of the micro-component extraction area 9 exist, meaning there are as many extractions available. In contrast, there are 124 copies of the micro-component extraction area 120 in FIG. 2. Suppose that the rectangular micro-component extraction area 9 is equal to two copies of the triangular micro-component extraction area 120 combined; there are then 8 more extractions corresponding to the micro-component extraction area 120, or 4 more corresponding to the micro-component extraction area 9, available in FIG. 2 than in FIG. 3. Wafer utilization as ideal as over 90% is obviously attainable when the carrying surface 12a is made correspondent to the shape of the micro-component extraction area 120. Notably, the micro-component extraction area 120 may extract more than 10000 micro-components at one time, thereby achieving the goal of mass transfer and increasing the efficiency of utilizing the wafers.

Figure 4:
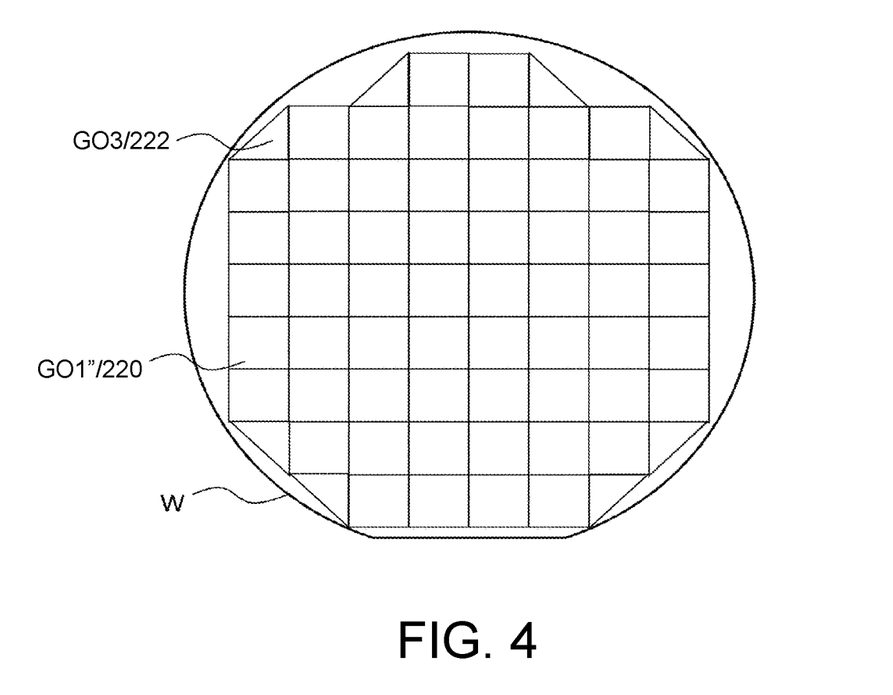
FIG. 4 depicts copies of a micro-component extraction area, in accordance with another embodiment of the present invention.

In one example, the micro-component extraction area 120 is likely to be adjusted; that is, the first geometric object may be changed dynamically. For instance, if the carrying surface 12a uses an electrostatic force to pick up micro-components within the micro-component extraction area 120, then the change of the first geometric object may be attained by conducting different electrodes. In practical application, please refer to FIG. 2 and FIG. 4, wherein FIG. 4 depicts a micro-component extraction area in accordance with an embodiment of the present invention. When the micro-component transfer head 12 extracts the micro-components near the center of the wafer W, the carrying surface 12a may adjust the first geometric object to be a larger rectangular area, such as the rectangular micro-components extraction area 220 (i.e. the first geometric object GO1"), so as to relatively increase the speed of extracting the micro-components. When the micro-component transfer head 12 extracts the micro-components near the margins of the wafer W, the carrying surface 12a may adjust the original first geometric object GO1" to be a smaller triangular area (i.e. the third geometric object GO3), such as the triangular micro-components extraction area 222; in this way, more micro-components would be extracted. The margins of said wafer W may be determined by a computer. For instance, when the micro-component transfer head 12 moves to any position above the wafer W, the computer may judge that the larger rectangular area set for the first geometric object GO1" is likely to exceed the margins of the wafer W; thus, the computer may determine said position is on the margins of the wafer W and then set the geometric objects to be the smaller third geometric objects GO3. In another example, when the micro-component transfer head 12 moves closer to the margins of the wafer W, the geometric objects may be set to much smaller geometric objects, thereby increasing the utilization of the wafer. Accordingly, it is understandable for a person having ordinary skill in the art to combine two or more than two geometric objects in the present embodiment to constitute the second geometric objects GO2.

In practice, after the micro-component transfer head 12 extracts the micro-components from the wafer W, it is still necessary to place them on a receiving substrate or a display substrate; therefore, how to make the arrangement of the micro-components on the receiving substrate or the display be easy to use in posterior production processing is a common issue. For instance, the display substrate may have a fixed size and aspect ratio due to the specification of products (e.g. wearable devices, mobile phones, or other displays), and the display substrate is usually rectangle (i.e. the second geometric object) with different types of aspect ratios. Accordingly, there is an advantage to make the micro-components extracted by the micro-component transfer head to constitute rectangles of different sizes and aspect ratios. While the present embodiment illustrates the first geometric object to be a right triangle as an example, a person having ordinary skill in the art would understand that it is not difficult to constitute rectangles of different sizes and aspect ratios based on even numbers of right triangles. As such, it is understandable for a person having ordinary skill in the art to combine two or more than two first geometric objects in the present embodiment to constitute the second geometric objects.

Notably, the shape of the first geometric object is not limited in the present embodiment. In one example, if the second geometric object is a rectangle, then the first geometric object may be a right triangle or a polygon having a right angle. If the second geometric object is a special polygon, the first geometric object may be objects of any shape capable of constituting the second geometric object, wherein such shape is not limited in the present embodiment. The position where the carrying surface 12a comes into contact with the wafer W is not limited as well. In practice, the position where the carrying surface 12a comes into contact with the wafer W may be associated with the first geometric objects of the micro-component extraction area 120.

Figure 5:
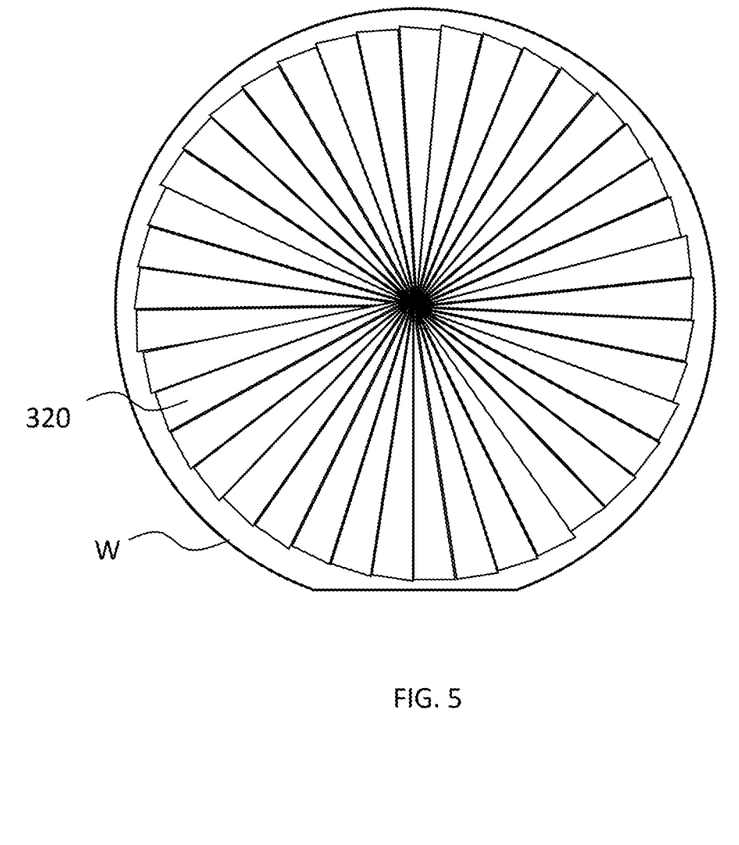
FIG. 5 depicts copies of a micro-component extraction area, in accordance with another embodiment of the present invention.

Please refer to FIG. 1 and FIG. 5, wherein FIG. 5 depicts a micro-component extraction area in accordance with an embodiment of the present invention, and the micro-component extraction area 320 is illustrated as a right triangle likewise. In the present embodiment, one end (i.e. the first end) of the right triangle is generally aligned with the center of the wafer W. The advantage of the present embodiment is that, the micro-component transfer head 12 is not necessary to move above the wafer W to the next micro-component extraction area 320; instead, it is performed by rotating the platform 10 to move the next micro-component extraction area 320 under the micro-component transfer head 12, thereby reducing the time for calibration of the position. The platform 10 may rotate the wafer W while generally keeping the center of the wafer W stationary; a person having ordinary skill in the art can understand that the rotation of the platform 10 will cause the wafer 10 above to rotate correspondingly as long as the rotation center of the platform 10 is generally aligned with the center of the wafer W. Additionally, when the first geometric object is relatively thin and long, the micro-component transfer head 12 is more likely to extract the micro-components closer to the margins of the wafer W, which further improves the utilization of the wafer. Suppose that the first geometric object is a right triangle having a long cathetus, a short cathetus, and a hypotenuse. The description of said relatively thin and long of the first objection may indicate the length of the long cathetus being 1.25 to 5 times the length of the short cathetus. For instance, the length of the long cathetus being less than 1.25 times the length of the short cathetus would decrease the utilization of the wafer, while the length of the long cathetus being greater than 5 times the length of the short cathetus would cause insufficient extraction of the micro-components. In one example, the length of the long cathetus may be 2, 3, or 4 times the length of the short cathetus, which is not limited in the present embodiment.

Figure 6:
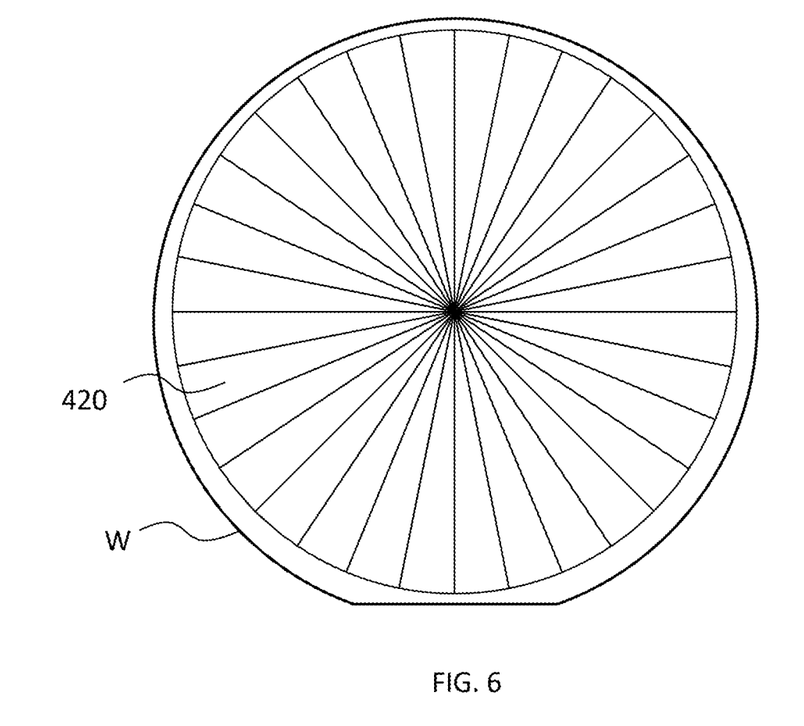
FIG. 6 depicts copies of a micro-component extraction area, in accordance with another embodiment of the present invention.

On the hand, the first geometric may be a non-polygon. Please refer to FIG. 1 and FIG. 6, wherein FIG. 6 depicts a micro-component extraction area in accordance with another embodiment of the present invention. The micro-component extraction area 420 as shown in this example may be a circular sector, and one end (i.e. the first end) of the circular sector may generally be aligned with the center of the wafer W. Similar to the previous embodiment, the micro-component transfer head 12 is not necessary to move above the wafer W to the next micro-component extraction area 420; instead, by rotating the platform 10, the micro-component transfer head 12 could be moved the next micro-component extraction area 420 under the micro-component transfer head 12. Moreover, when the first geometric object comprises an arc, it could further improve the utilization of the wafer as the arc is closer to the shape of the wafer W. The present embodiment does not stipulate how many degrees the central angles are; one of them may be 10°, 15°, 30°, or 60°. The central angle greater than or equal to 60° may reduce the frequency of the movement for extraction; particularly, the central angle may be a factor of 360 to reduce the frequency of the movement for extraction. The present embodiment does not stipulate in which situation to design the first geometric object to be a circular sector; to constitute a circular second geometric object, a person having ordinary skill in the art may choose to design the first geometric object as a circular sector. As long as the required second geometric object can be constituted by the first geometric object, it is not limited to whether the first geometric object is a polygon or a fan shape or other forms, and the first geometric object can also be a special polygon, such as a sawtooth shape.

Figure 7:
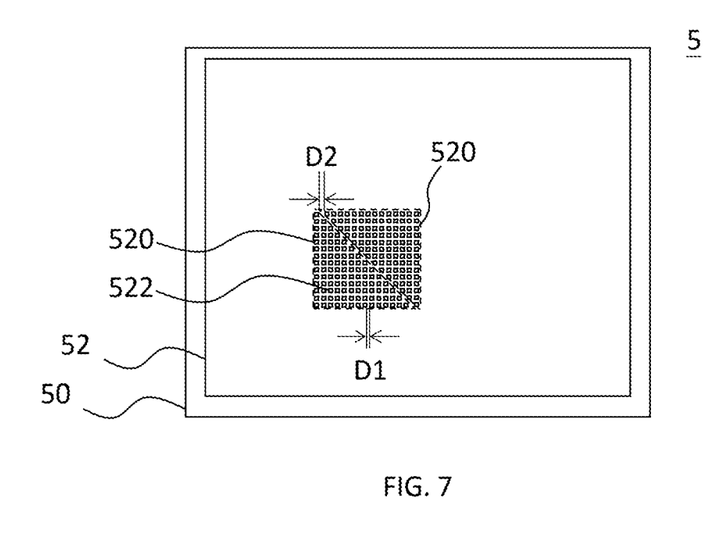
FIG. 7 depicts a micro-component display, in accordance with an embodiment of the present invention.

Please refer to FIG. 1 and FIG. 7, wherein FIG. 7 depicts a micro-component display in accordance with another embodiment of the present invention. The micro-component transfer head 12 extracts the micro-components on the wafer W and then place them on a receiving substrate 50. The receiving substrate 50 may be a part of the micro-component display 5, configured with a driver circuit to drive the display. The receiving substrate 50 comprises a display surface 52 which contains a plurality of micro-component carriage areas 520. Each of the micro-component carriage areas 520 may conform with a first geometric object. The distance between the micro-components 522 within the same one of the micro-component carriage areas 520 are separated by a first distance D1 apart, and the micro-components 522 within different ones of the micro-component carriage areas 520 are separated by at least a second distance D2, wherein the first distance D1 is unequal to the second distance D2. In a practical example, the micro-component transfer head 12 may perform a batch transfer of the micro-components 522 from the wafer W to the receiving substrate 50; that is, the micro-component transfer head 12 may come into contact with the display surface 52 multiple times on the receiving substrate 50. As shown in FIG. 7, the different micro-component carriage areas 520 correspond to the micro-components 522 of different batches. In one example, the shape of the micro-component carriage area 520 may correspond to the shape of the micro-component extraction area as described previously; for example, the micro-component carriage area 520 may be the first geometric object as described.

In practice, the adjacent micro-component carriage areas 520 may not be aligned closely perhaps due to alignment issues or other factors. Therefore, if the adjacent micro-components 522 in the same column (or the same row) are from different micro-component carriage areas 520, these two micro-components 522 may be separated far away. Conversely, if the adjacent micro-components 522 in the same column (or the same row) are from the same micro-component carriage areas 520, these two micro-components 522 may be separated with a shorter distance. That is, in some examples, the first distance D1 may be smaller than or equal to the second distance D2. The shape of the micro-component carriage areas 520 (i.e. the first geometric object) in the present embodiment may be a right triangle, and through the transfer of the micro-component transfer head 12 the right triangle may constitute a rectangle for example (i.e. the second geometric object). Thus, there is an advantage to make the micro-components 522 extracted by the micro-component transfer head 12 to constitute different sizes and aspect ratios of the display surface 52 (i.e. conforming with the second geometric object) of the micro-component display 5, thereby improving the utilization of the wafer W and the efficiency to transfer the micro-components 522 to the micro-component display 5. Only two micro-component carriage areas 520 are shown for illustration; yet in one embodiment not shown, the micro-component carriage areas 520 may fill up the display surface 52, but the invention is not limited thereto.

In summary, the micro-component transfer head and the micro-component transfer device provided in the present invention may change the shape of the micro-component extraction areas to be non-rectangular, such that the micro-component extraction areas may be closer and extend to the margins of the wafer. In this way, it can facilitate access to hard-to-extract micro-components by the fringe of a wafer and improve the utilization of the wafer. Moreover, the micro-component display provided in the present invention includes a plurality of micro-component carriage areas, and each of the micro-component carriage areas is able to receive a plurality of the micro-components transferred in a batch from the micro-component transfer head and the micro-component transfer device; hence, the mass transfer of the micro-components could be achieved.

What is claimed is:

1. A micro-component transfer head, comprising:
   a carrying surface corresponding to a micro-component extraction area; and
   a side when looked from the outside of the micro-component transfer head and that is opposite to and farthest from the carrying surface, wherein the shape of the side differs from the shape of the first geometric object, and an area of said other side is greater than an area of the carrying surface;
   wherein the micro-component extraction area conforms with a first geometric object, the first geometric object comprises at least an acute angle, and n copies of the first geometric object constitute a second geometric object, n being an integer greater than 1;
   wherein the second geometric object comprises at least a right angle, the first geometric object is dissimilar in shape to the second geometric object, the carrying surface is configured to extract, when coming into contact with a surface of a wafer, a plurality of micro-components situated at the surface of the wafer and within the micro-component extraction area, the orthogonal projection of the micro-component extraction area on the surface of the wafer is the first geometric object, and the orthogonal projection of the carrying surface on the surface of the wafer defines the micro-component extraction area.

2. The micro-component transfer head according to claim 1, wherein the first geometric object is triangular, and the second geometric object is rectangular.

3. The micro-component transfer head according to claim 2, wherein the first geometric object further comprises a right angle, and n is an even number.

4. The micro-component transfer head according to claim 3, wherein the first geometric object is a right triangle having a long cathetus and a short cathetus, the length of the long cathetus being 1.25 to 5 times the length of the short cathetus.

5. The micro-component transfer head according to claim 1, wherein the first geometric object is a circular sector, and the second geometric object is circular.

6. The micro-component transfer head according to claim 1, further configured to adjust, subject to a command, the micro-component extraction area into conforming with a third geometric object, the area of the third geometric object unequal to the area of the first geometric object.

7. A micro-component transfer device, configured to extract a plurality of micro-components in a wafer, and comprising:
   a platform configured to hold the wafer; and
   a micro-component transfer head positioned opposite the platform and comprising:
      a carrying surface corresponding to a micro-component extraction area; and
      a side when looked from the outside of the micro-component transfer head and that is opposite to and farthest from the carrying surface, wherein the shape of the side differs from the shape of the first geometric object, and an area of said other side is greater than an area of the carrying surface;
   wherein the micro-component extraction area conforms with a first geometric object, the carrying surface is configured to extract, when coming into contact with a surface of the wafer, the micro-components situated at the surface of the wafer and within the micro-component extraction area, the orthogonal projection of the micro-component extraction area on the surface of the wafer is the first geometric object, and the orthogonal projection of the carrying surface on the surface of the wafer defines the micro-component extraction area, and a first end of the first geometric object is generally aligned with the center of the wafer.

8. The micro-component transfer device according to claim 7, wherein the first end of the first geometric object is an acute angle.

9. The micro-component transfer device according to claim 8, wherein the first geometric object is triangular or a circular sector.

10. The micro-component transfer device according to claim 9, wherein the first geometric object is a right triangle having a long cathetus and a short cathetus, the length of the long cathetus being 1.25 to 5 times the length of the short cathetus.

11. The micro-component transfer device according to claim 8, wherein the platform is further configured to rotate the wafer while generally keeping the center of the wafer stationary.

12. The micro-component transfer device according to claim 7, wherein the micro-component transfer head is further configured to adjust, subject to a command, the micro-component extraction area into conforming with a third geometric object, the area of the third geometric object unequal to the area of the first geometric object.

13. The micro-component transfer device according to claim 12, wherein the area of the third geometric object is less than the area of the first geometric object.

14. A micro-component display, comprising:
   a receiving substrate having a display surface, the display surface comprising a plurality of micro-component carriage areas;
   wherein each of the micro-component carriage areas conforms with a first geometric object;
   wherein the first geometric object comprises at least an acute angle, and within each of the micro-component carriage areas there are a plurality of micro-components;
   wherein every two adjacent micro-components within the same one of the micro-component carriage areas and arranged in a row/column direction are spaced a first distance apart, every two adjacent micro-components respectively within different ones of the micro-component carriage areas and arranged in the row/column direction are separated by at least a second distance, the first distance being unequal to the second distance, and the micro-component carriage areas fill up the display surface.

15. The micro-component display according to claim 14, wherein:
   the display surface contains a second geometric object;
   n copies of the first geometric object constitute the second geometric object, n being an integer greater than 1;
   the second geometric object comprises at least a right angle; and
   the first geometric object is dissimilar in shape to the second geometric object.

16. The micro-component display according to claim 15, wherein the shape of the display surface conforms with the second geometric object.

* * * * *